United States Patent [19]  [11] 4,285,002
Campbell  [45] Aug. 18, 1981

[54] INTEGRATED CIRCUIT PACKAGE

[75] Inventor: William Campbell, Oldham, England

[73] Assignee: International Computers Limited, London, England

[21] Appl. No.: 3,954

[22] Filed: Jan. 16, 1979

[30] Foreign Application Priority Data

Jan. 19, 1978 [GB] United Kingdom ............. 2169/78

[51] Int. Cl.³ ................. H01L 23/10; H01R 43/02
[52] U.S. Cl. ............................. 357/74; 29/827; 357/80; 357/81
[58] Field of Search ............... 29/832, 834, 588, 589, 29/827, 577 R; 357/74, 80, 81; 174/52 S

[56] References Cited

U.S. PATENT DOCUMENTS

| | | | |
|---|---|---|---|
| 3,872,583 | 3/1975 | Beall et al. | 29/827 |
| 3,908,185 | 9/1975 | Martin | 357/74 |
| 4,142,203 | 2/1979 | Dietz | 357/74 X |

OTHER PUBLICATIONS

IBM Tech. Discl. Bull., vol. 15, No. 1, Jun. 1972 by W. R. DeBoskey.

Primary Examiner—Lowell A. Larson
Assistant Examiner—C. J. Arbes
Attorney, Agent, or Firm—Hane, Roberts, Spiecens & Cohen

[57] ABSTRACT

A large scale integrated circuit package including a base or substrate section and a lid structure of thermally conductive material to which the chip or die of the package is mounted. A frame defining a recess for the chip is provided on the lid and the frame carries conductive tracks which are coupled to the connector pads of the chip or die. The base has a recess which accommodate the chip and frame and which is closed by the lid structure. The base of the recess is provided with conductive tracks which co-operate with those on the frame. The electrical connections between the two sets of tracks is formed by thermo-compression techniques.

5 Claims, 7 Drawing Figures

INTEGRATED CIRCUIT PACKAGE

BACKGROUND OF THE INVENTION

This invention relates to large scale integrated circuit (L.S.I.) chip or die packages and to methods of constructing such packages.

THE PRIOR ART

Known forms of package for an L.S.I. chip or die having a plurality of contact pads to which contact has to be made include a carrier unit which is shaped to provide a space for receiving the chip, and a lid unit for hermetically enclosing the space within the carrier unit.

Usually the carrier unit includes a main body of insulating material. A cooling unit, i.e. a heat sink forming arrangement, is provided on the main body, at a location opposite to the location region at which the chip or die is mounted. The carrier unit includes contact arrangements which are intended to be connected by way of connections to the chip pads and which are connected by way of internal connections to conductor leads which project from the carrier unit.

In the known arrangements the chip or die is secured to the carrier unit.

SUMMARIES OF THE INVENTION

According to a first aspect of the invention there is provided a large scale integrated circuit package comprising
(a) a substrate structure having
(a1) external circuit connection pins,
(a2) a recess extending from a surface thereof for accommodating a large scale integrated circuit element and providing a base region spaced from said surface;
(a3) a means on the recess base region defining a pattern of conductive tracks connecting with the connection pins;
(b) a lid structure of thermally conductive material which is so dimensioned as to be able to close off the recess, the lid structure having
(b1) a second pattern of conductive tracks on the surface thereof facing the recess and positioned as to be electrically co-operable with the pattern of tracks on the recess base region, when the lid structure is secured to the substrate structure;
(c) a large scale integrated circuit element attached to the lid structure; and
(d) conductor means electrically connecting the large scale integrated circuit element to the second pattern conductor tracks.

In accordance with a second aspect of the invention there is provided a method of introducing a large scale integrated circuit element into a package, including a substrate structure having a recess, and lid structure for closing the recess, including the steps of forming the lid structure from a thermally conductive material; providing the lid structure with a ring-like frame; mounting the large scale integrated circuit element on the underside of the lid structure such that when the latter is secured to the substrate structure the circuit element enters the recess; providing a pattern of conductive tracks on the frame which are to be connected to the connection pads of the circuit element, and with the pattern of tracks provided on a surface associated with the recess in the substrate structure,; connecting the connection pads to the tracks on the frame; and connecting the lid structure to the substrate structure in such manner that said tracks of the frame are electrically connected to the tracks of the substrate structure.

Preferably the connections between the two track patterns are formed by a thermo-compression bonding arrangement in which a blob, bump, ball or the like element of conductive material is interposed between each pair of tracks to be electrically interconnected and is compressed to provide the required electrical connections between the tracks to be connected during the attachment of the lid unit to the body unit.

BRIEF DESCRIPTION OF THE DRAWINGS

For a better understanding of the invention, reference will now be made to the accompanying drawings in which.

DESCRIPTION OF PREFERRED EMBODIMENT

For convenience of description and for facilitating understanding of the significance of the invention it is proposed to describe on general terms an embodiment of an integrated circuit package assembly incorporating the features of the invention and to then consider a method of producing the integrated circuit package assembly.

Figure 1:
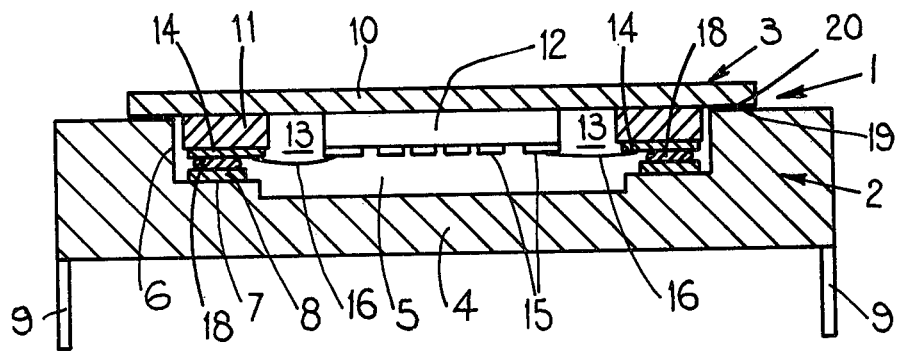
FIG. 1 is a cross-section view of a package incorporating the features of the invention.
Figure 2:
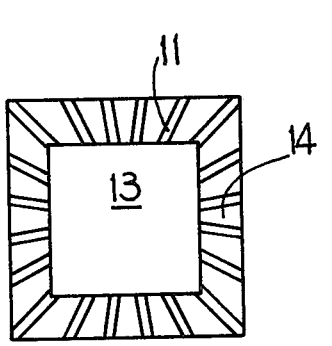
FIG. 2 is a plan view of a detail of the package FIG. 1.
Figure 4:
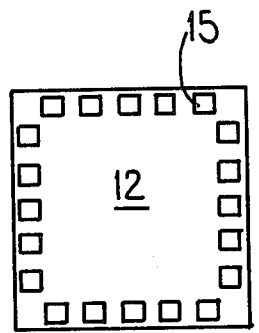
FIG. 4 is a schematic plan view of the L.S.I. chip provided in the package of FIG. 1.
Figure 3:
FIG. 3 is a sectional side view of the detail of FIG. 2.

Referring now to FIG. 1, of the drawings this particularly shows in part cross-section a package assembly 1 including a carrier or body unit 2 and a lid and integrated circuit chip unit 3.

The body unit 2 has a main body 4 with a centrally and symmetrically disposed recess 5 having a generally rectangular—usually square—shape. The recess 5 has a stepped peripheral wall 6 which provides a horizontal peripheral platform or ledge 7 which is provided with an arrangement or pattern of radially directed conductive tracks 8. These tracks 8 are connected by way of conductor arrangements (not shown) with pins 9 depending from the main body. It will be understood that the number of pins 9 does not necessarily correspond to the number of tracks 8 since various tracks may need to be electrically connected.

The lid unit 2 includes a metal plate 10. A rectangular open frame 11, termed a window frame is secured to the underside of the plate 10. The frame 11 is dimensioned so that it is able to enter the recess in the body unit and engage with the ledge 7. An integrated circuit element, die or chip 12 (hereinafter called a die) is secured to the central region of the lid plate 10 to be positioned symmetrically within the space 13 defined by the interior of the frame 11. That surface of the frame 11 that faces towards the ledge 7 carries a pattern of further conductive tracks 14 which is complimentary to the pattern of the tracks 8 on the ledge 7.

Connection pads 15 are provided upon the die 12 and are electrically connected to respective ones of the tracks 14 by means of beam leads or wires 16. As so far described it will be understood that the die 12 is mounted directly upon the metal plate 10 so that it is in direct thermal contact with the plate structure. In addition, it will be noted that the die is effectively spaced from the base of the recess 5 of the main body.

A method of forming the above described assembly from its components will now be discussed.

The frame 11 is formed from a ceramic material and is initially provided on one surface with the pattern of the tracks 14 of conductive material. The tracks are formed by thick film of gold which can be deposited by any of the conventionally used film depositing techniques. These tracks 14 match up with the bonding pads 15 provided upon the die 12. The opposite face of the frame 11 is coated with a layer 17 of low melting point glass or a refractive metal which can conveniently be soldered and also because dimensional tolerances can be maintained to relatively small values. The glass is intended to serve as the bonding media for securing the frame 11 to the lid forming metal plate 10.

The frame 11 is bonded to the metal plate 10 using a heatable jig (not shown) so as to enable the desired sitting of the frame 11 with respect to the plate 10.

It will be understood that this bonding process effectively achieves a glass-to-metal seal between the frame 11 and the surface of the plate 10. Following attachment of the frame to the plate, the combination is subjected to cleaning and inspection operations. After which the die 12 is attached to the plate 10 in such a manner that the die is symmetrically positioned within the frame space 13, and with the pads 15 of the die correctly oriented with respect to the tracks 14 on the frame 11. The die can be attached to the plate by using an eutectic alloy such as Au/Si. The pads 15 of the die are then electrically coupled to the tracks by means of beam leads or wires 16 which bridge the space between the pads 15 and the frame 11 and tracks 14.

In practice, it is desirable to arrange that the connections between the beam leads 16 and the tracks 14 are such that the leads connect with the inner ends of the tracks—i.e. the track ends adjacent the internal periphery of the frame. The bonding of the leads can be effected by the methods disclosed in my co-pending application Ser. No. 928385. The efficacy of the bonding of the beam leads 16 is electrically tested by means of probes which are caused to contact with the outer ends of the tracks 14 on the frame 11.

This testing process provides a check as to the acceptability of the lid unit 2, and effectively completes the stages involved in the preparation of the unit 3.

The process steps particularly related to the package unit will now be considered.

For the purpose of description it will be presumed that the package unit 2 is available and has been tested and found satisfactory.

It will be appreciated from the above description that such a package has a conductive track pattern which is complimentary to the track pattern formed upon the frame 11.

Figure 6:
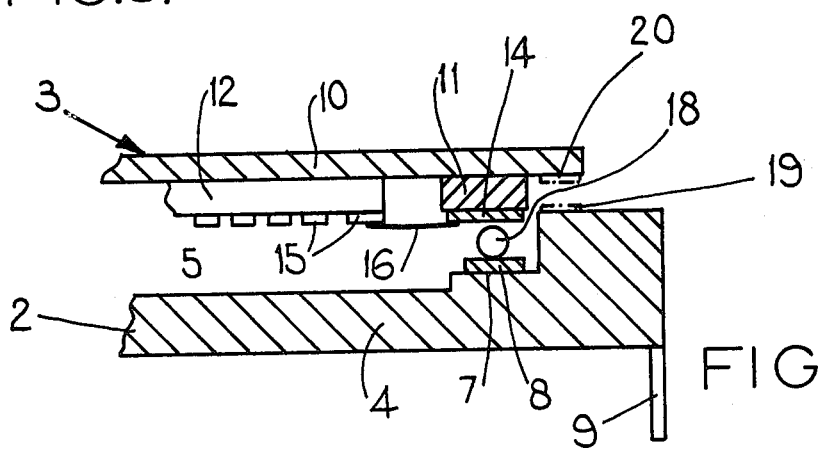
FIG. 6 is a part sectional view of the package immediately prior to sealing the side assembly of FIG. 5 to the remainder of the package of FIG. 1.
Figure 5:
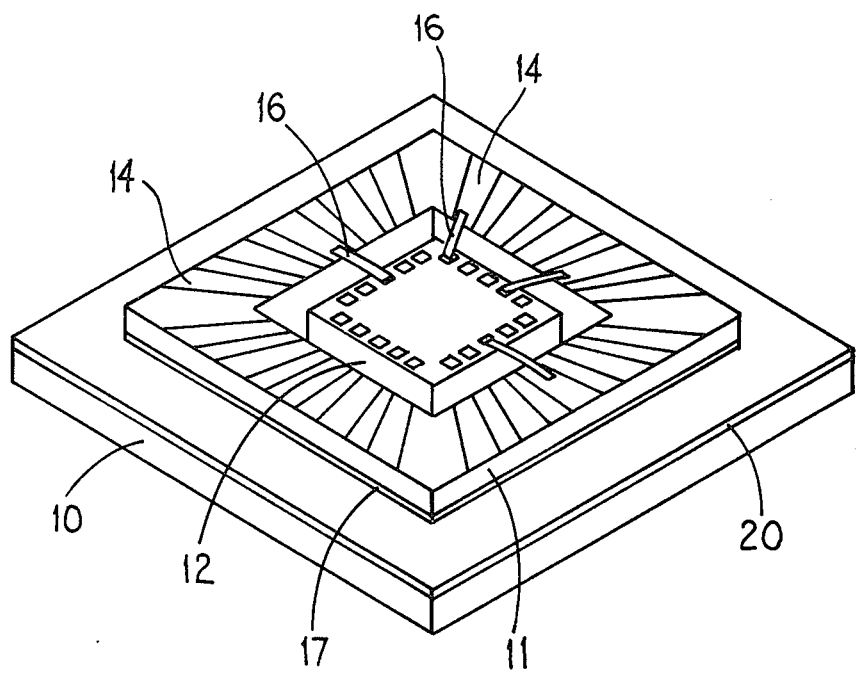
FIG. 5 is a perspective view of the lid assembly of the package.
Figure 7:
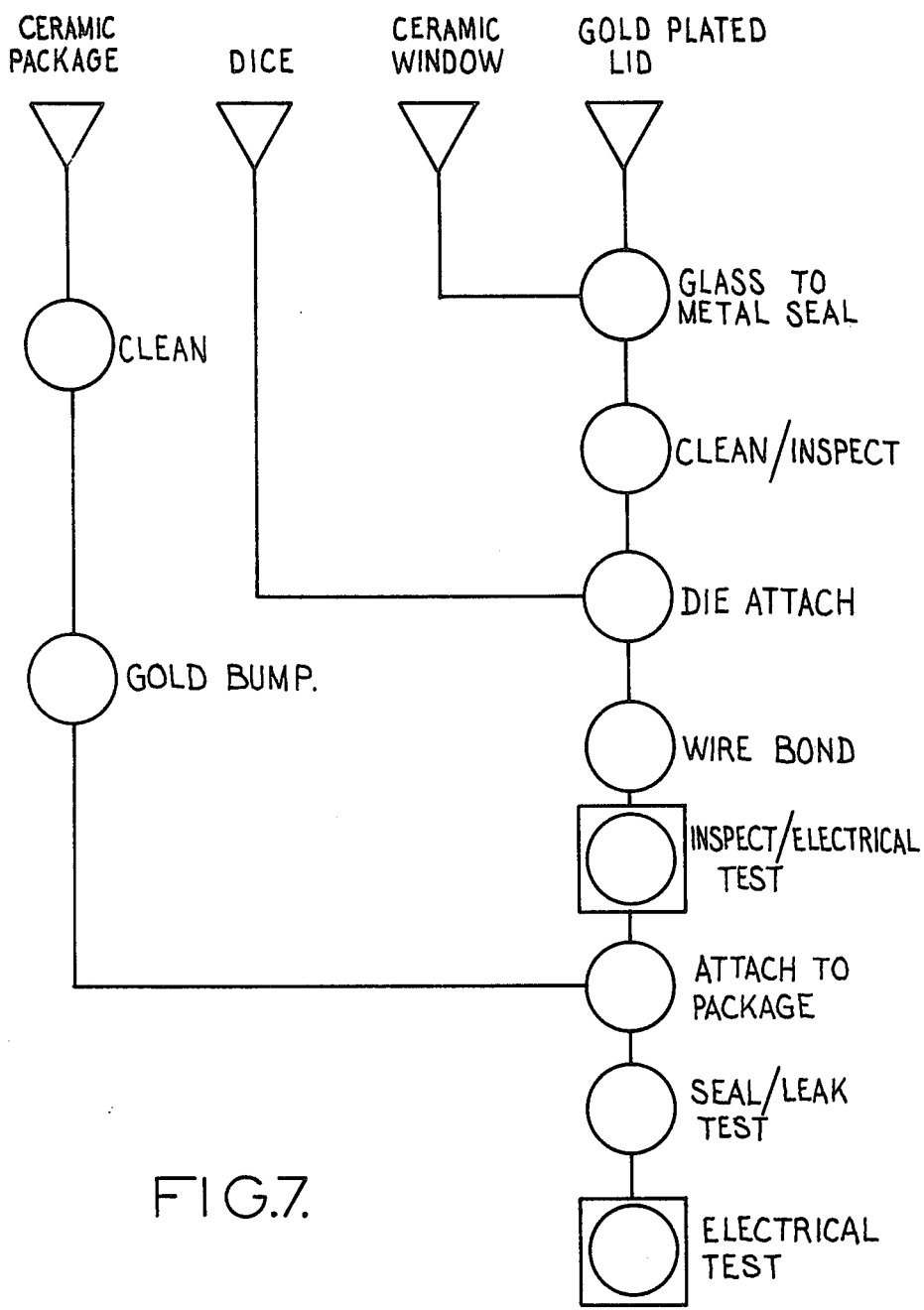
FIG. 7 is a process flow diagram illustrating the principal stages in the formation of the package incorporating the features of the invention.

Following cleaning operations a small blob, bump or ball 18 of gold (FIG. 6) is provided upon each one of the tracks 8 of the body unit. These balls 18 can be applied by a variety of techniques. One such technique involves individually applying a small ball of gold to the track by a hollow probe or needle (not shown) in which a reduced air pressure is produced. The needle is introduced into an environment in which a supply of gold balls are maintained in continuous motion. In view of the reduced pressure produced within the probe or needle, gold balls 18 will be drawn towards the probe. As soon as a ball is drawn to the probe it is, by means of suction, held against the tip of the probe. The probe is advanced towards the package track and then by means of a heating effect produced at the top of the probe the gold ball 18 is caused to adhere to the package track 8. Whereafter the probe is caused to entrain a further gold ball. This process is repeated as often as is required to provide each package track 8 with a gold ball 18.

A second mode of applying a blob 18 of gold to the package tracks is to use a continuous feed of gold wire to a region in which a hydrogen flame is produced, or to a capacitive discharge machine which produces a high temperature in its workpiece receiving area, in which the gold is introduced. In each case the gold is heated sufficiently for a small ball of gold to be formed at the end of the wire. The ball is made to contact the track to which it is to be connected. After which the ball is snapped-off from the remainder of the wire thereby leaving a ball of gold on the track. As before the process is repeated until each of the package tracks has been provided with a gold ball.

The gold balls are intended to make the electrical connection between the tracks 8 of the ceramic package unit 2 and the tracks 14 of the lid unit 3. The lid and package units are then connected together. This interconnection of the two units 2 and 3 basically involves accurately aligning the tracks 8 and 14 of the respective units 2 and 3. This is effectively indicated in FIG. 6.

One method of effecting the alignment is to use an optical device (not shown) including two mirrors arranged at an angle to each of them so as to be able to direct simultaneously an image from each mirror to a viewing eye piece and the like (not shown). The lid and body units 2 and 3 are placed in face-to-face spaced relationship to each other and the device is positioned so that one of the mirrors is so set relative to the plane of the surface 7 that the viewing axis of the eye piece is parallel to the said package plane. By directing light towards the mirrors the two sets of tracks are illuminated and an image of each set of tracks is simultaneously produced at the eye piece. The lid unit 3 is positionally adjusted with respect to the body unit 2 until the images of the tracks are accurately aligned in the eye piece. It will be appreciated that the two units will be mounted in a suitable jig arrangement which enables the required controlled setting of the units with respect to each other. After the two units have been accurately aligned the optical device is removed and the lid unit 3 is advanced towards the body unit 2 and the peripheral regions of the plate 10 are bonded to the facing surface of the package unit 2 by suitable bonding process such as a solder reflow technique or an electric welding process. This bonding is effected over a bonding area 19 of the body unit which co-operates with the marginal edge regions of the plate 10.

In practice, it is usually necessary to interpose a metallic preform 20 between the lid plate and the package which provides the material enabling the reflow soldering process. The preform co-operates with the area 19, such preform can be a frame of a gold-tin alloy or eutectic or the previously mentioned gold layer.

The relative dimensions of the thickness of the ceramic frame 11, the depth of the recess 5 to the step 7 and the size of the gold balls or blobs 18 are so chosen and inter-related that the attachment of the lid unit 3 to the package unit 2 simultaneously produces a compression bond between the two facing track patterns 8, 14 by reason of the deformation or crushing of the gold balls 18.

After the lid plate 10 has been attached to the package unit 2, the periphery of the lid 10 can be sealed with a solder seam to attain hermetic sealing of the interior of the package assembly, thereby to eliminate damage arising from a working environment atmosphere.

Thus, for example, in a particular package assembly the tolerance in the dimension of the depth of the step 7 from the surface of the body unit was 0.002" and that of the ceramic frame thickness 0.002" together with the tolerance of the frame position with respect to the lid. Furthermore, the diameter of the balls 18 has to be such that the balls have a compression capability which exceeds 0.006" so that the worst case of tolerances can be accommodated.

As has been previously mentioned since the die 12 is secured directly to the lid plate 10, it is possible fully to test the die 12 before the die is effectively electrically connected to the package unit. In practice, this is advantageous since the package unit is a relatively expensive unit.

To enhance heat transfer from the die 12, heat finning (not shown) can, if desired, be attached to the lid and thus be effectively in good thermal contact with the die 12.

It will be understood that the lid plate 10 has to be made of a material with a good thermal conductivity and with thermal expansion characteristics which match those of the ceramic body. Thus for example, the plate could be a molydenum and copper laminate; or from a ceramic material with the requisite thermal conductivity properties, i.e. a metallised ceramic.

I claim:

1. A large scale integrated circuit package including;
   a main body structure having a plurality of external circuit connection pins, a recess bounded by a peripheral wall and a first pattern of conductive tracks positioned in the recess and being electrically connected to the circuit connection pins; and
   a lid structure of thermally conductive material closing the recess, the lid structure carrying a second pattern of conductive tracks complementary to said first pattern on an inner surface thereof, a large scale integrated circuit element having connection pads, the circuit element being attached to said inner surface of the lid structure and extending into the recess, electrical conductors providing connections between the connection pads of the large scale integrated circuit and the second pattern of conductive tracks and connector elements providing electrical connections between the first and second conductive patterns.

2. A large scale integrated circuit package as claimed in claim 1, in which the peripheral wall of the recess is stepped to provide a face on which the first pattern of conductive tracks is carried and in which the lid structure includes a frame surrounding the large scale integrated circuit element, the frame member carrying the second pattern of conductive tracks.

3. A method of manufacturing a large scale integrated circuit package including the steps of;
   providing a main body structure having a plurality of external circuit connection pins, a recess bounded by a peripheral wall and a first pattern of outwardly facing conductive tracks positioned in the recess and being electrically connected to the connection pins;
   providing a lid structure of thermally conductive material, mounting on a surface thereof a large scale integrated circuit element having connection pads so that when the lid structure is secured to the main body structure the circuit element extends into the recess, providing a second pattern of conductive tracks complementary to said first pattern on said surface and electrically connecting the connection pads of the circuit element to the second pattern of conductive tracks;
   positioning the lid structure relative to the main body structure so that the first and second patterns of conductive tracks are aligned in face-to-face relationship;
   placing a deformable connector element between corresponding conductive tracks of the first and second patterns; and
   securing the lid structure to the main body structure so that a compression bond is formed between said corresponding conductive tracks by deformation of the connector elements.

4. A method as claimed in claim 3 including the further steps of;
   forming a step in the peripheral wall of the recess to provide a face perpendicular to the wall and forming said first pattern of conductive tracks thereon; and
   providing a frame surrounding said large scale integrated circuit element, forming said second pattern of conductive tracks thereon and attaching the frame to said surface of the lid structure.

5. A method as claimed in claim 3, in which the lid structure is hermetically sealed to the main body structure.

* * * * *